(12) United States Patent
Shih et al.

(10) Patent No.: US 9,343,431 B2
(45) Date of Patent: May 17, 2016

(54) DAM STRUCTURE FOR ENHANCING JOINT YIELD IN BONDING PROCESSES

(71) Applicant: Taiwan Semiconductor Manufacturing Company, Ltd., Hsin-Chu (TW)

(72) Inventors: Ying-Ching Shih, Taipei (TW); Szu Wei Lu, Hsin-Chu (TW); Jing-Cheng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 130 days.

(21) Appl. No.: 13/939,003

(22) Filed: Jul. 10, 2013

(65) Prior Publication Data

US 2015/0014863 A1 Jan. 15, 2015

(51) Int. Cl.
*H01L 25/065* (2006.01)
*H01L 23/00* (2006.01)
*H01L 25/00* (2006.01)
(Continued)

(52) U.S. Cl.
CPC ...... *H01L 25/0657* (2013.01); *H01L 23/49816* (2013.01); *H01L 24/17* (2013.01); *H01L 24/81* (2013.01); *H01L 24/94* (2013.01); *H01L 24/97* (2013.01); *H01L 25/50* (2013.01); *H05K 3/3436* (2013.01); *H01L 23/49827* (2013.01); *H01L 24/02* (2013.01); *H01L 24/05* (2013.01); *H01L 24/13* (2013.01); *H01L 24/16* (2013.01); *H01L 24/32* (2013.01); *H01L 24/83* (2013.01); *H01L 2224/024* (2013.01); *H01L 2224/0401* (2013.01); *H01L 2224/0557* (2013.01); *H01L 2224/06181* (2013.01); *H01L 2224/131* (2013.01); *H01L 2224/13144* (2013.01); *H01L 2224/13147* (2013.01); *H01L 2224/13155* (2013.01); *H01L 2224/13164* (2013.01); *H01L 2224/16145* (2013.01); *H01L 2224/16225* (2013.01); *H01L 2224/16227* (2013.01); *H01L 2224/1703* (2013.01); *H01L 2224/17181* (2013.01); *H01L 2224/32145* (2013.01); *H01L 2224/32225* (2013.01); *H01L 2224/73204* (2013.01); *H01L 2224/81001* (2013.01); *H01L 2224/81007* (2013.01); *H01L 2224/81191* (2013.01); *H01L 2224/81192* (2013.01); *H01L 2224/831* (2013.01); *H01L 2224/94* (2013.01); *H01L 2224/97* (2013.01); *H01L 2225/06513* (2013.01); *H01L 2225/06541* (2013.01); *H01L 2924/00014* (2013.01); *H01L 2924/15311* (2013.01); *H01L 2924/181* (2013.01); *H01L 2924/18161* (2013.01); *H01L 2924/3511* (2013.01); *H01L 2924/3841* (2013.01);
(Continued)

(58) Field of Classification Search
CPC ..... H01L 25/0657; H01L 25/50; H01L 24/97; H01L 24/94
See application file for complete search history.

(56) References Cited

U.S. PATENT DOCUMENTS 6,919,642 B2 * 7/2005 Hsieh ............... H01L 21/563
257/778
7,279,795 B2 * 10/2007 Periaman ........... H01L 25/0657
257/772

(Continued)

*Primary Examiner* — John P Dulka
(74) *Attorney, Agent, or Firm* — Slater Matsil, LLP

(57) ABSTRACT

A package structure includes a bottom package component, a top package component overlying and bonded to the bottom package component, and a dam between the bottom package component and the top package component. The dam has a top surface attached to a bottom surface of the top package component, and a bottom surface spaced apart from a top surface of the bottom package component.

20 Claims, 10 Drawing Sheets

(51) Int. Cl.
  *H01L 23/498* (2006.01)
  *H05K 3/34* (2006.01)

(52) U.S. Cl.
  CPC ............... *H05K 2201/10568* (2013.01); *H05K 2201/10734* (2013.01); *H05K 2201/2036* (2013.01); *Y02P 70/613* (2015.11)

(56) References Cited

U.S. PATENT DOCUMENTS

| | | | |
|---|---|---|---|
| 7,432,602 B2 | 10/2008 | Kuramochi | |
| 8,643,148 B2 * | 2/2014 | Lin | H01L 23/49827 257/620 |
| 8,829,667 B2 | 9/2014 | Park et al. | |
| 2001/0038144 A1 * | 11/2001 | Grigg | 257/698 |
| 2005/0205984 A1 * | 9/2005 | Chen-Tung | H01L 23/16 257/687 |
| 2009/0243090 A1 * | 10/2009 | Kim | H01L 21/563 257/737 |
| 2009/0294938 A1 * | 12/2009 | Chen | H01L 23/3128 257/676 |
| 2010/0127377 A1 | 5/2010 | Bauer et al. | |
| 2011/0210436 A1 * | 9/2011 | Chow et al. | 257/686 |
| 2012/0068353 A1 | 3/2012 | Huang et al. | |
| 2012/0098123 A1 * | 4/2012 | Yu et al. | 257/737 |
| 2012/0126395 A1 * | 5/2012 | Lee | H01L 21/561 257/737 |
| 2012/0305916 A1 | 12/2012 | Liu et al. | |
| 2013/0075937 A1 | 3/2013 | Wang et al. | |
| 2013/0168744 A1 | 7/2013 | Hsu et al. | |
| 2013/0341773 A1 | 12/2013 | Bauer et al. | |
| 2014/0036466 A1 | 2/2014 | Pahl et al. | |
| 2014/0353838 A1 | 12/2014 | Lin et al. | |
| 2014/0367854 A1 * | 12/2014 | Zhao | H05K 3/4688 257/738 |
| 2015/0008580 A1 * | 1/2015 | Joh | H01L 23/49811 257/738 |
| 2015/0061127 A1 | 3/2015 | Chen et al. | |

* cited by examiner

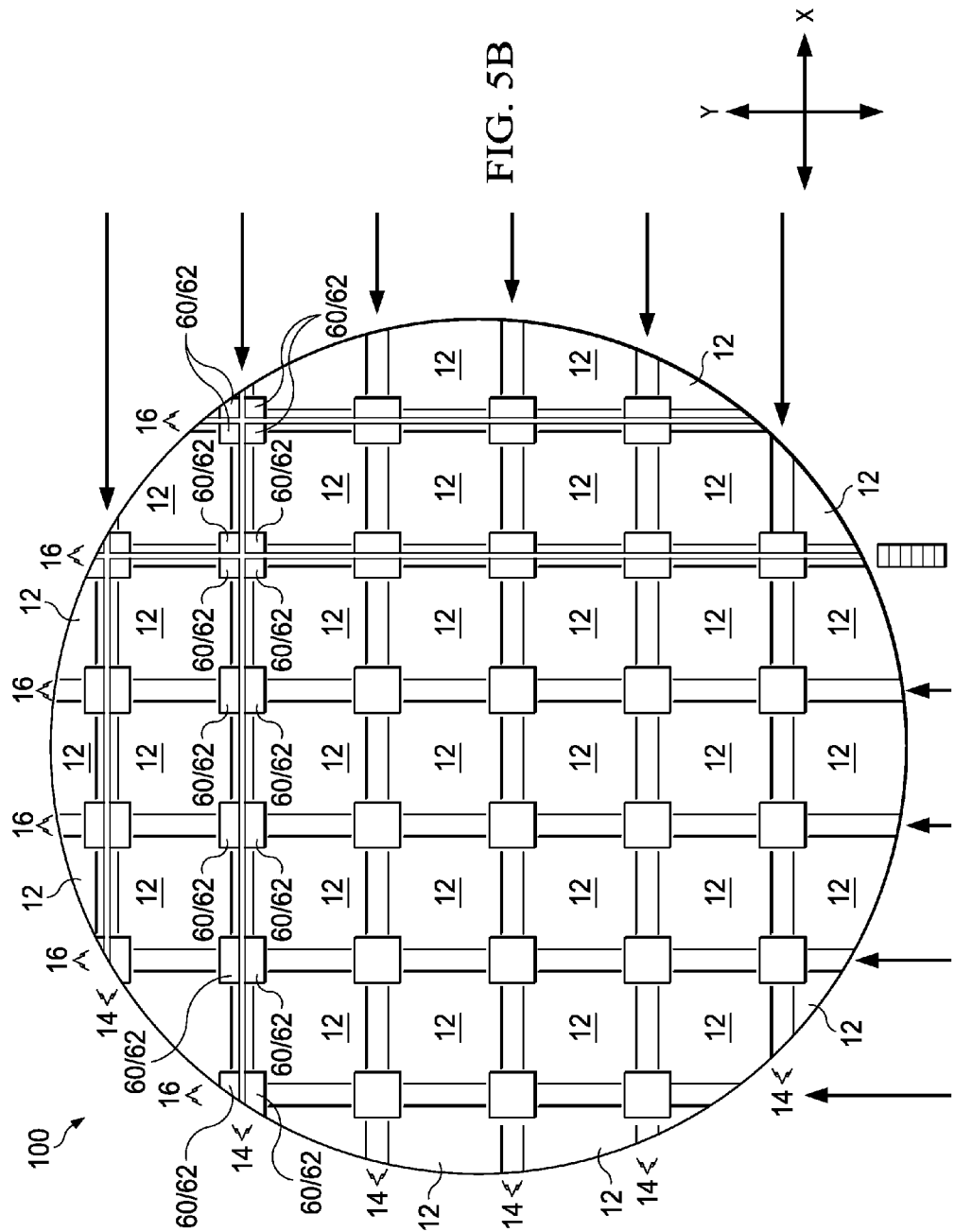

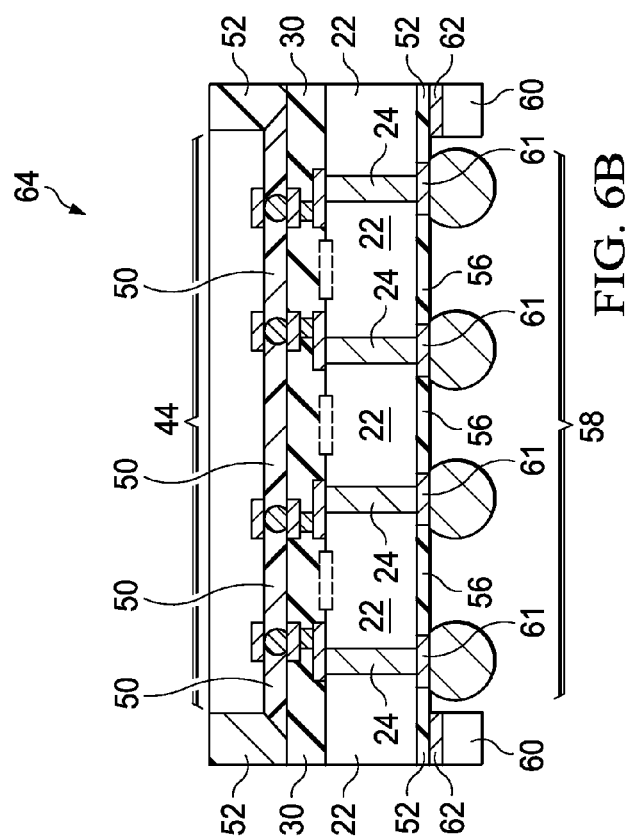
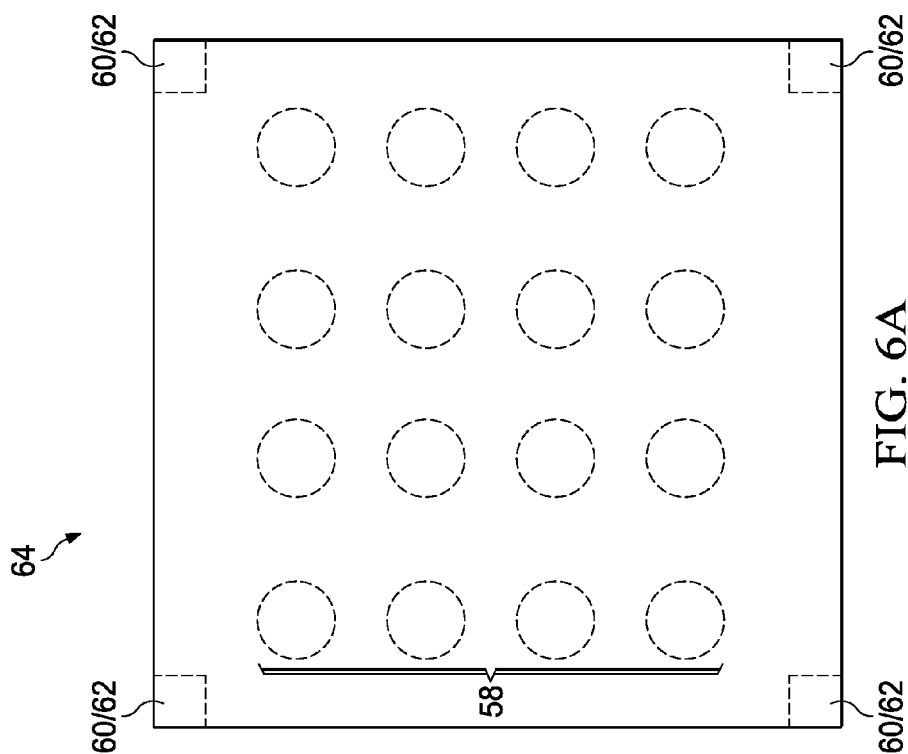

US 9,343,431 B2

DAM STRUCTURE FOR ENHANCING JOINT YIELD IN BONDING PROCESSES

BACKGROUND

In the packaging of integrated circuits, a plurality of top dies may be bonded on an interposer wafer, which comprises a plurality of interposers therein. After the bonding of the top dies, an underfill may be dispensed into the gaps between the top dies and the interposer wafer. A curing process may then be performed to cure the underfill. A molding compound can be applied to mold the top dies therein. The resulting interposer wafer and the top dies thereon are then sawed apart into a plurality of packages. The packages may then be bonded to package substrates.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 9 are cross-sectional views, top views, and bottom views of intermediate stages in the manufacturing of a package in accordance with some exemplary embodiments.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A Chip-on-Wafer-on-Substrate (CoWoS) package and the methods of forming the same are provided in accordance with various exemplary embodiments. The intermediate stages of forming the package are illustrated. The variations of the embodiments are discussed. Throughout the various views and illustrative embodiments, like reference numbers are used to designate like elements.

Figure 1A:
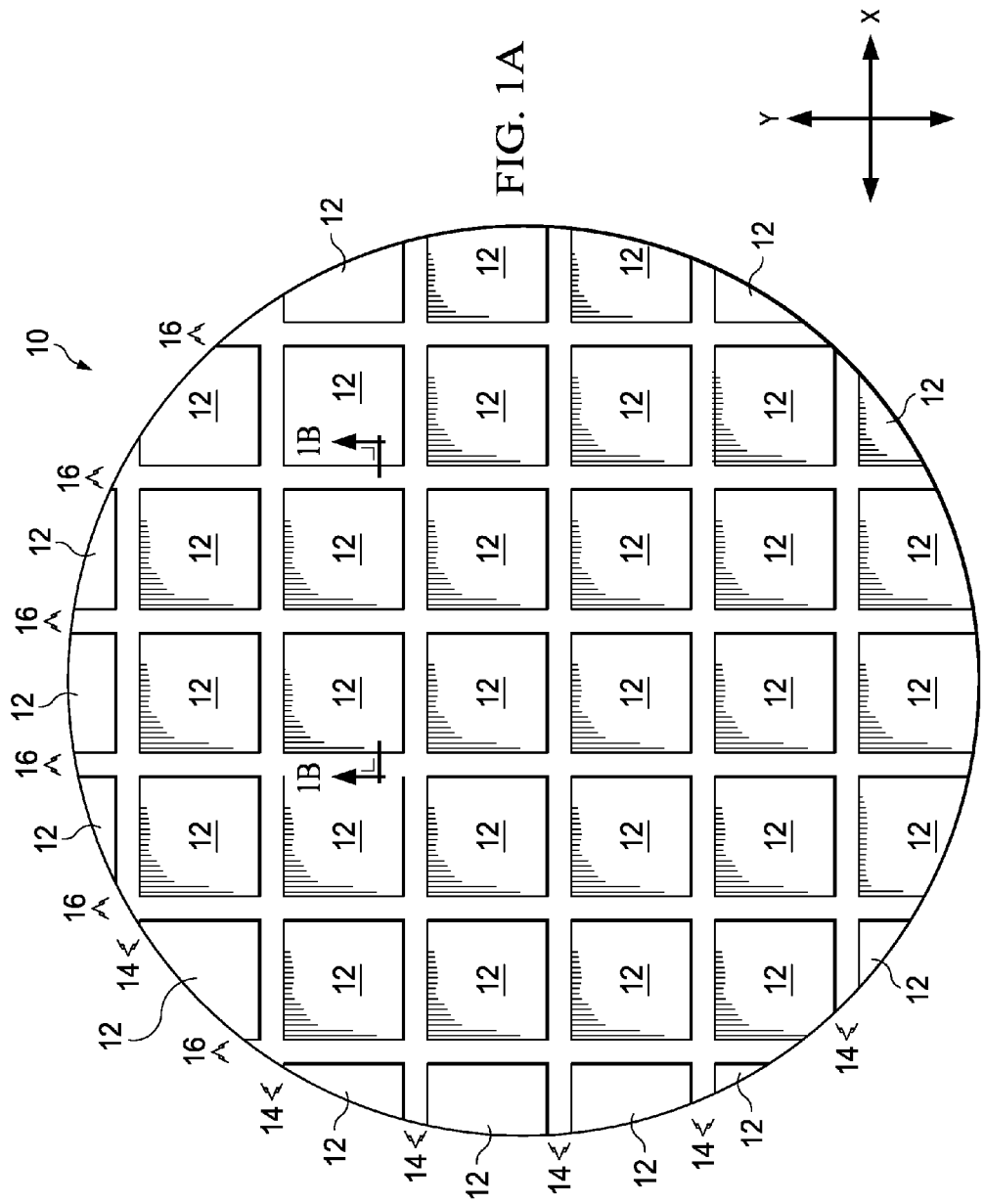

FIG. 1A illustrates a schematic top view of wafer 10 in accordance with some exemplary embodiments. Wafer 10 includes chips 12 and the adjoining scribe lines 14 and 16, wherein scribe lines 14 and 16 separate chips 12 from each other. Chips 12 are alternatively referred to as dies 12 hereinafter. Scribe lines 14 have longitudinal directions parallel to the X direction, and scribe lines 16 have longitudinal directions parallel to the Y direction, which is perpendicular to the X direction. In each of chips 12, there may be a seal ring (not shown) formed, wherein the outer boundaries of the seal rings define the outer boundaries of chips 12. Each of the scribe lines 14 is between and adjoining two rows of chips 12, and each of the scribe lines 16 is between and adjoining two columns of chips 12.

Figure 1B:
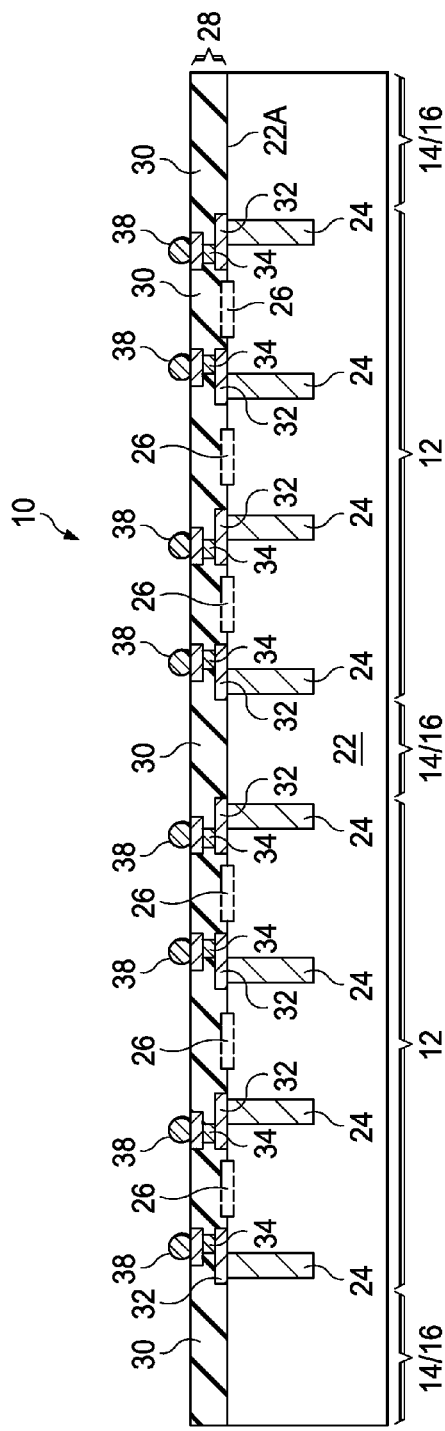

FIG. 1B illustrates a cross-sectional view of a portion of wafer 10. The cross-sectional view in FIG. 1B is obtained from the plane containing line 1B-1B in FIG. 1A. As shown in FIG. 1B, wafer 10 includes substrate 22. In some embodiments, substrate 22 is a semiconductor substrate, which may further be a crystalline silicon substrate, although it may be formed of other semiconductor materials such as silicon germanium, silicon carbon, a III-V compound semiconductor, or the like. In alternative embodiments, substrate 22 is a dielectric substrate comprising, for example, silicon oxide. Wafer 10 may be a device wafer that includes active devices/circuits 26, which may include transistors (not shown) formed at surface 22A of semiconductor substrate 22. When wafer 10 is a device wafer, it may also include passive devices (not shown) such as resistors and/or capacitors. In alternative embodiments, wafer 10 is an interposer wafer that does not include active devices therein. In these embodiments, wafer 10 may, or may not, include passive devices formed therein. Through-vias (TVs) 24 may be formed to extend from top surface 22A of substrate 22 into substrate 22. TVs 24 are also sometimes referred to as through-substrate vias or through-silicon vias when substrate 22 is a silicon substrate.

Interconnect structure 28 is formed over substrate 22, and is used to electrically connect to the integrated circuit devices 26, if any, and/or TVs 24. Interconnect structure 28 may include a plurality of dielectric layers 30. Metal lines 32 are formed in dielectric layers 30. Vias 34 are formed between, and interconnecting, the overlying and underlying metal lines 32. Metal lines 32 and vias 34 are sometimes referred to as Redistribution Lines (RDL) 32/34 throughout the description. In some embodiments, dielectric layers 30 comprise silicon oxide, silicon nitride, silicon carbide, silicon oxynitride, combinations thereof, and/or multi-layers thereof. Alternatively, dielectric layers 30 may comprise one or more low-k dielectric layer having a low k value(s). The k values of the low-k dielectric materials in dielectric layers 30 may be lower than about 3.0, or lower than about 2.5, for example. Dielectric layers 30 may also comprise polymers.

Electrical connectors 38 are formed at the top surface of wafer 10. In some embodiments, solder balls. In alternative embodiments, electrical connectors 38 comprise electrical connectors 38 comprise metal pillars, wherein solder caps may be, or may not be, formed on the top surfaces of the metal pillars. In yet other embodiments, electrical connectors 38 may be composite bumps comprising copper posts, nickel layers, solder caps, Electroless Nickel Immersion Gold (ENIG), Electroless Nickel Electroless Palladium Immersion Gold (ENEPIG), and/or the like.

Figure 2:
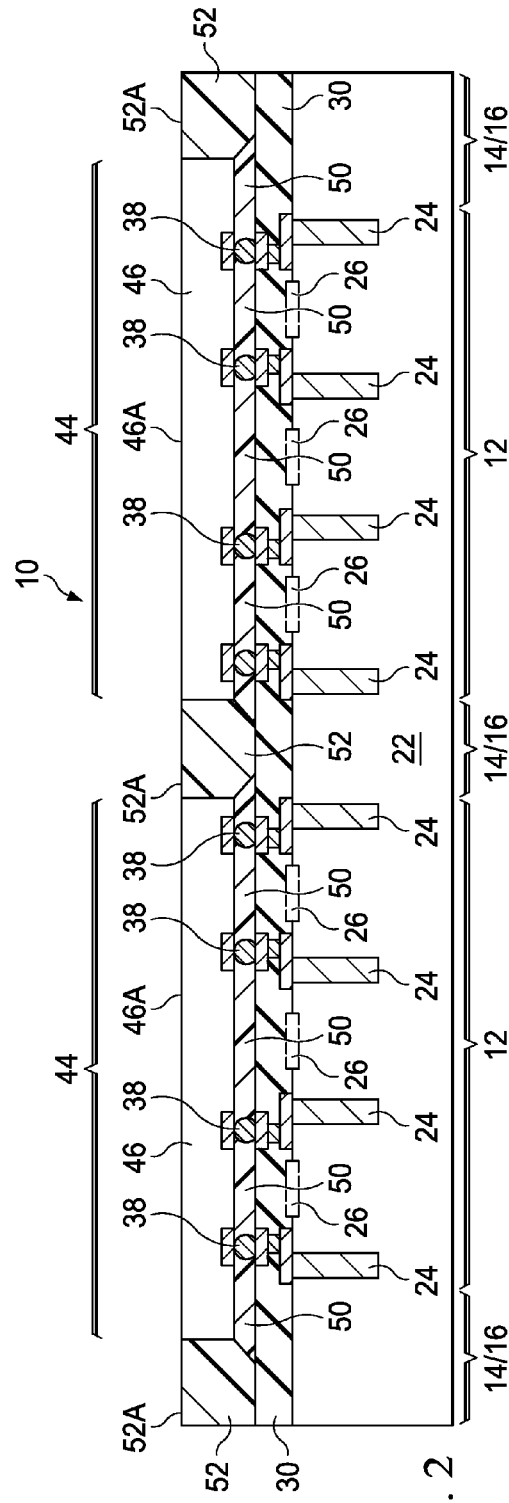

Referring to FIG. 2, package components 44 are bonded to chips 12, for example, through flip-chip bonding. Electrical connectors 38 accordingly electrically couple the circuits in package components 44 to RDLs 32 and TVs 24 in chips 12. Package components 44 may be device dies including logic circuits, memory circuits, or the like. Accordingly, package components 44 are alternatively referred to as top dies 44 throughout the description. Alternatively, package components 44 may be packages that include dies bonded to the respective interposers, package substrates, and/or the like. On each of chips 12, there may be one or more top die 44 bonded thereon. In some embodiments, top dies 44 include substrates 46, which may be silicon substrates in some embodiments. In alternative embodiments, substrates 46 are formed of materials such as silicon germanium, silicon carbide, III-V compound semiconductors, or the like.

Next, polymer 50 is dispensed into the gaps between top dies 44 and chips 12. Polymer 50 may be an underfill, and hence is referred to as underfill 50 hereinafter, although it may also comprise other polymers such as an epoxy. Underfill 50 may also be a molding underfill.

Molding material 52, which may be a polymer, is molded on top dies 44 and chips 12, for example, using compress molding. In some embodiments, molding material 52 comprises a molding compound, an epoxy, or the like. A curing step is performed to cure molding material 52, wherein the curing may be a thermal curing, a Ultra-Violet (UV) curing, or the like. In the embodiments top dies 44 are buried in molding material 52, after the curing of molding material 52, a planarization step, such as a grinding, may be performed to remove excess portions of molding material 52, which excess portions are over top surfaces 46A of top dies 44. Accordingly, surfaces 46A of substrates 46 are exposed, and are level with top surface 52A of molding material 52.

Figure 3:
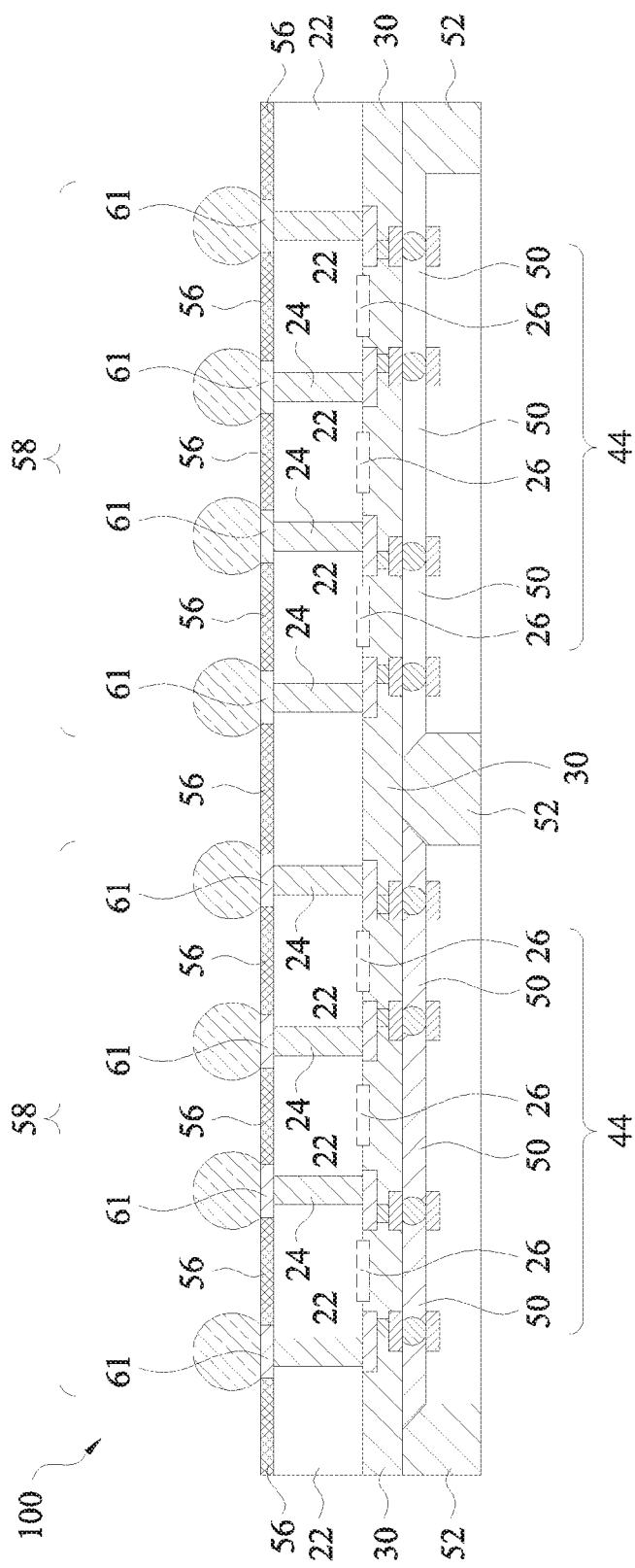

FIG. 3 illustrates the formation of the backside structure of chips 12. In the formation of the backside structure, a backside grinding is performed on the backside of semiconductor substrate 22 to thin semiconductor substrate 22, until TVs 24 are exposed. Dielectric layer (or dielectric layers) 56 is formed on the backside of semiconductor substrate 22. Electrical connectors 58 are also formed on the backside of chips 12 and electrically couple to TVs 24. In some embodiments, electrical connectors 58 are solder balls, and hence are referred to as solder balls 58 throughout the description. In other embodiments, electrical connectors 58 may comprise metal pads, metal bumps, solder caps, or the like. RDLs may be formed on the backside of chips 12 and in dielectric layers 56, wherein features 61 represent the RDLs. Although one layer of RDL is illustrated, there may be a plurality of layers of RDLs. Solder balls 58 may be used to bond to an additional electrical component (not shown), which may be a semiconductor substrate, a package substrate, a Printed Circuit Board (PCB), or the like. Throughout the description, the structure shown in FIG. 3 is referred to as composite wafer 100, which includes wafer 10, top dies 44, and molding material 52.

Figure 4A:
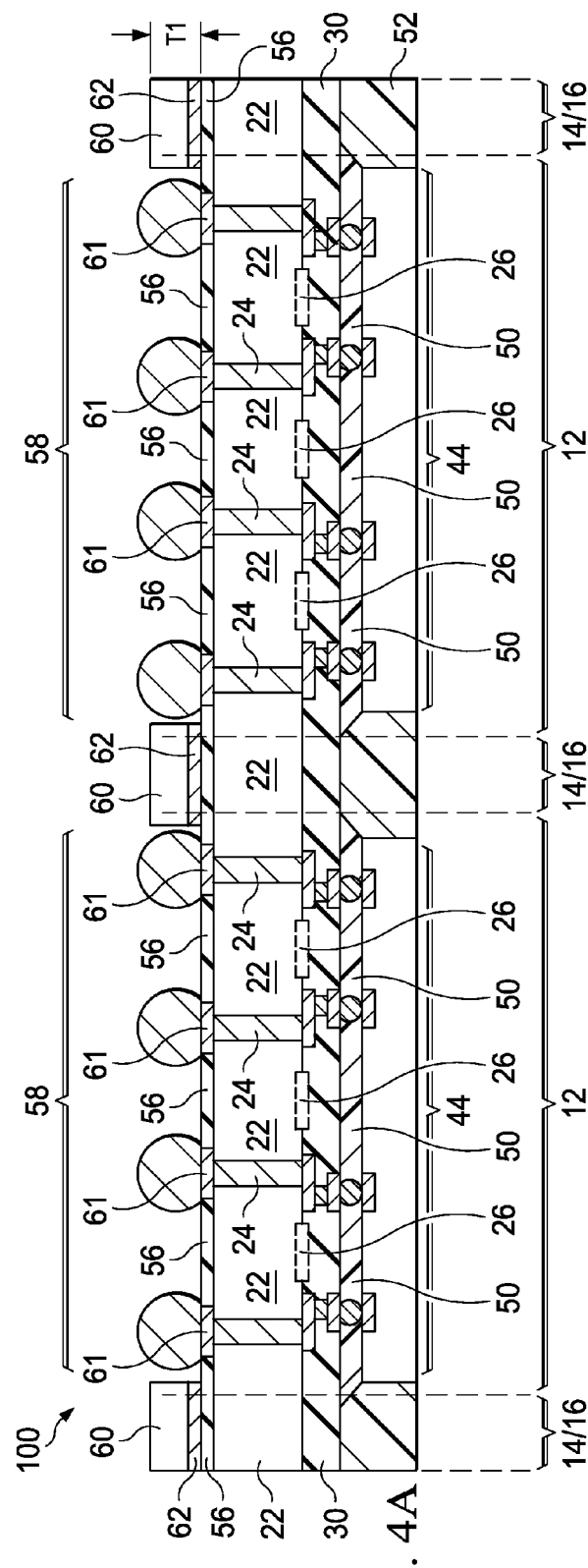

Referring to FIG. 4A, dams 60 are attached to a side of composite wafer 100, which side is also the same side chips 12 are located. Dams 60 and top dies 44 are on the opposite sides of wafer 10. Dams 60 may comprise silicon, glass, metal, an organic material, or the like. In some embodiments, dams 60 may be adhered to surface dielectric layer 56 through adhesive 62. The optimum thickness T1 of Dams 60 and the respective adhesives 62 is related to various factors, including the size of electrical connectors 58, the CTEs of the materials in composite wafer 100, the size of chips 12, and the like. In some embodiments, thickness T1 is between about 30 µm and about 200 µm. It is appreciated, however, that the values recited throughout the description are merely examples, and may be changed to different values.

Figure 4B:
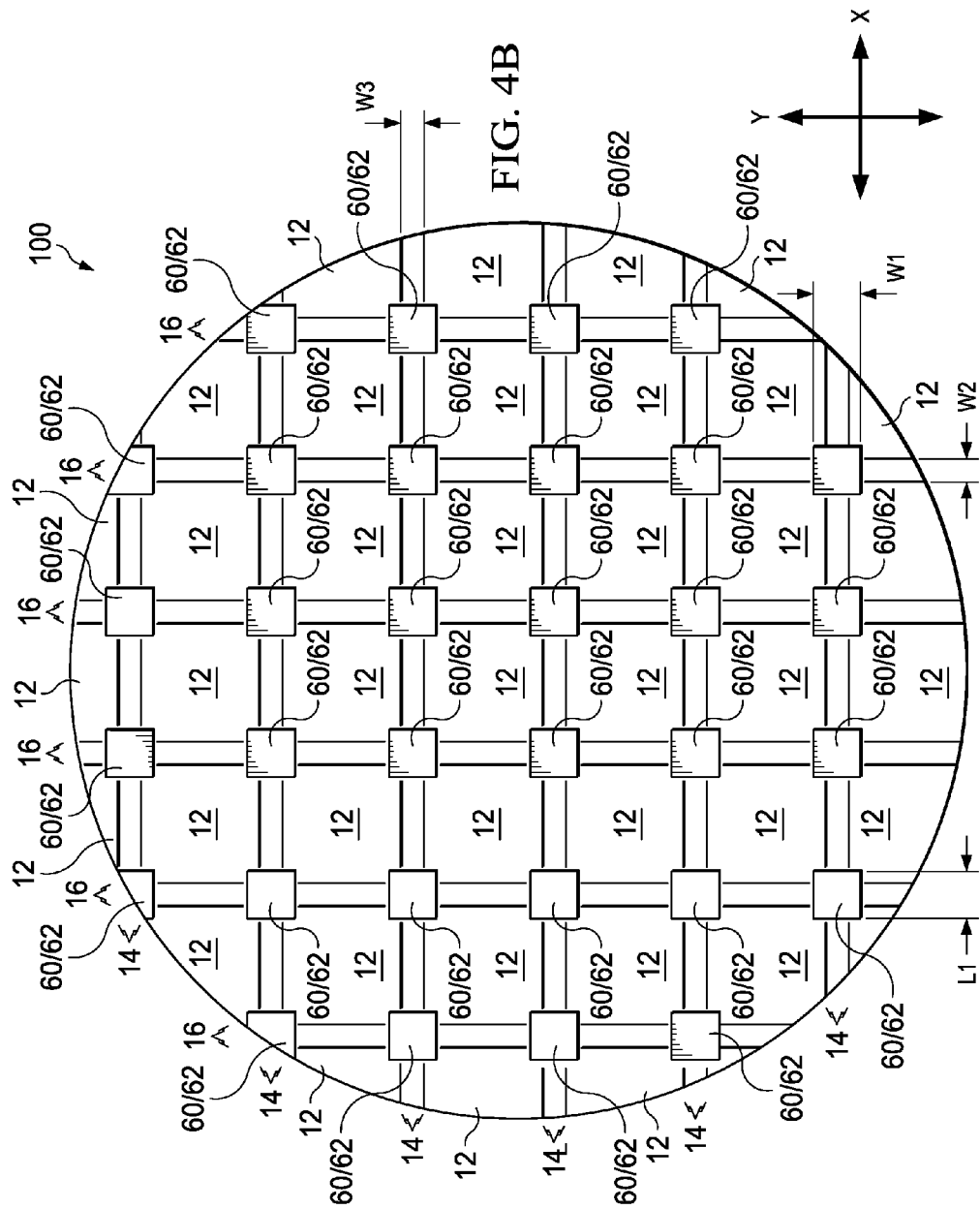

FIG. 4B illustrates a top view of the structure in FIG. 4A. As shown in FIG. 4A, dams 60 comprise portion overlapping scribe lines 14 and 16. Furthermore, dams 60 may overlap the entireties of the overlap regions of scribe lines 14 and 16, and may further extend to overlap some corner portions of chips 12. In alternative embodiments, dams 60 are limited in the overlap regions of scribe lines 14 and 16, and do not extend to overlap chips 12. Dams 60 may have length L1 and width W1 substantially equal to or greater than widths W2 and W3 of scribe lines 16 and 14, respectively.

Figure 5A:
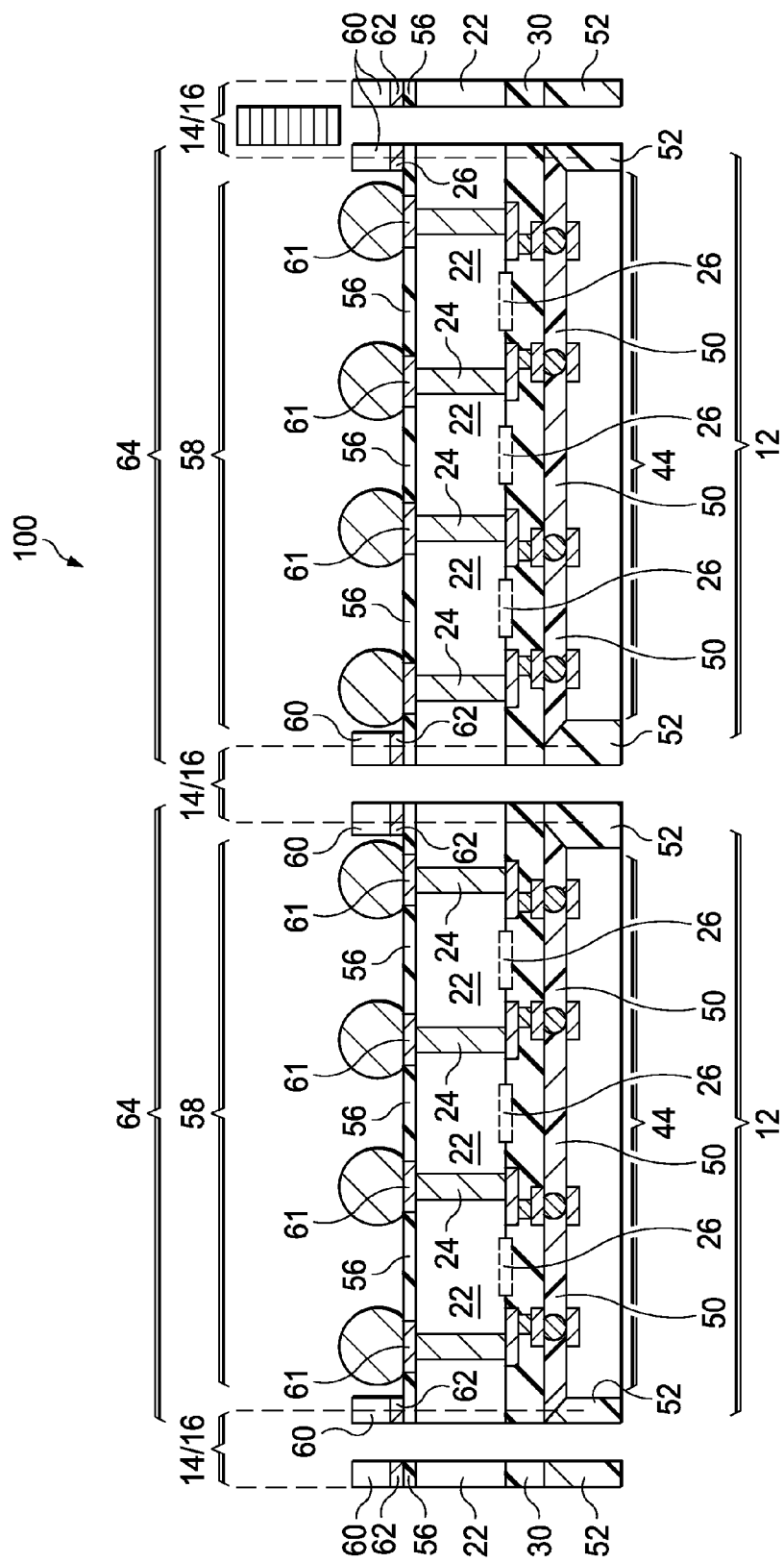

Next, as shown in FIGS. 5A and 5B, composite wafer 100 is sawed apart into a plurality of packages 64, wherein each of packages 64 include chip 12, top die 44, and molding material 52. FIGS. 5A and 5B illustrate a cross-sectional view and a top view, respectively, of the sawing step. During the die-sawing, the kerf passes through the middle portions of scribe lines 14 and 16. Furthermore, each of the kerves separates each of the respective dams 60 in the same scribe line into two portions that are on the opposite sides of the respective kerf. As may be found from FIG. 5B and FIG. 6A, when packages 64 are separated from each other, each of packages 64 may include four dams 60, with each of the four dams 60 at one corner of package 64.

An exemplary package sawed from composite wafer 100 is shown in FIGS. 6A and 6B, which illustrate a top view and a cross-sectional view, respectively, of package 64. Since dams 60 are sawed in the die-sawing process, two edges of dams 60 are aligned to the respective two edges of package 64, as shown in FIGS. 6A and 6B.

Figure 7:
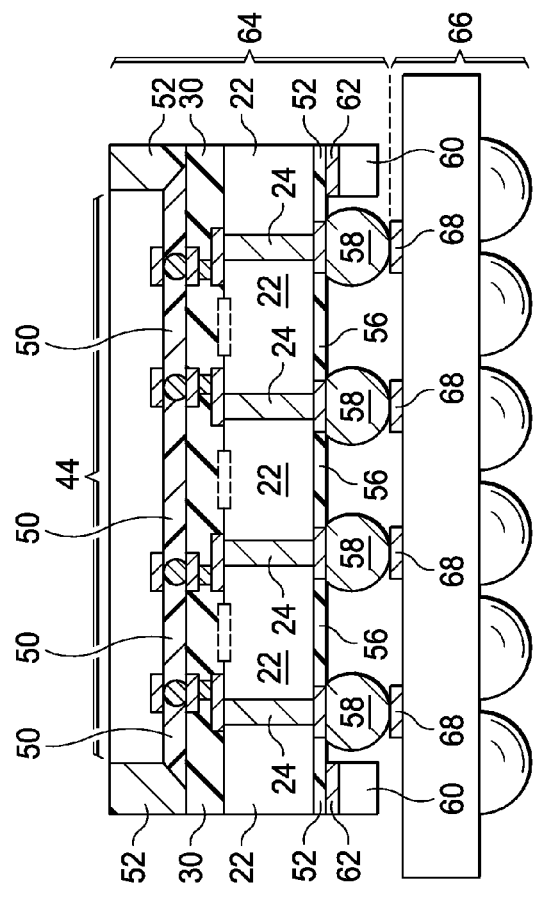

FIG. 7 illustrates the placement of package 64 on package component 66. Package 64 is alternatively referred to as a top package hereinafter. Solder balls 58 are aligned to, and are put against, the electrical connectors 68 of package component 66. Package component 66 may comprise a package substrate, which may further be a build-up substrate including a core (not shown) therein. Alternatively, package component 66 comprises a laminate substrate including a plurality of laminated dielectric films, with redistribution lines (not shown) disposed in the laminated dielectric films. In yet other embodiments, package component 66 comprises a Printed Circuit Board (PCB). Dams 60 are located in the space between top package 64 and package component 66. In some embodiments, the bottom surfaces of dams 60 are spaced apart from the top surface of package component 66 by gaps, wherein the top surface of package component 66 may also be a top surface of a topmost dielectric layer in package component 66.

Figure 8:
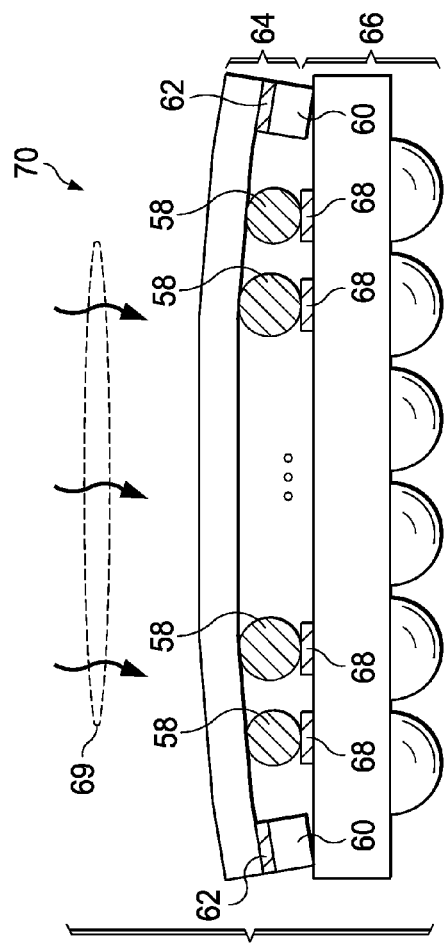

Next, as schematically shown in FIG. 8, a reflow (represented by arrows 69) is performed on the structure shown in FIG. 8, and solder balls 58 are reflowed. The reflow may be convection reflow in some embodiments. Top package 64 and package component 66 are thus bonded to each other through flip-chip bonding. The resulting package is referred to as package 70. In the bonding process, due to the mismatch between the materials in top package 64, top package 64 suffers from warpage. For example, molding material 52 (FIG. 2) in chip 12 may have a CTE significantly greater than the CTE of substrate 22 in chip 12. Accordingly, when heated, the upper portion of top package 64 expands more than the lower portion of top package 64. As a result, the top package 64 suffers from warpage, and the edge portions of top package 64 are lower than the center portion, as schematically illustrated in FIG. 8. As a result of the warpage, the edge portions of top package 64 may be too close to package component 66, and cause the edge solder balls 58 (which are close to the edges of top package 64) to be crushed. This in turn results in the widths of the edge solder balls 58 to increase, and may cause the bridging of edge solder balls 58. With dams 60, however, when the warpage is severe, dams 60 are in contact with, and are blocked by, the top surface of package component 66. This prevents the further lowering of the edge portions of package component 64. Dams 60 thus define the minimum allowable distance between the edges of top package 64 and package component 66, the crushing of edge solder balls 58 is thus prevented. The thickness T1 of dams 60 may thus be designed to define the optimum value of the minimum distance.

Figure 9:
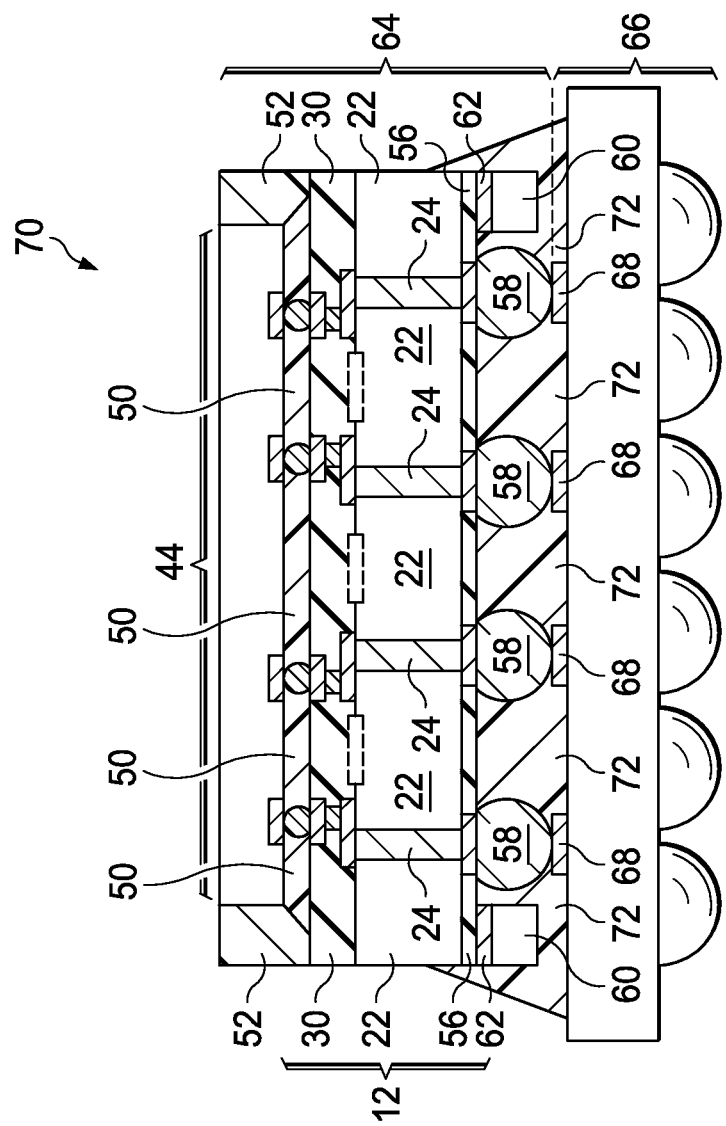

Referring to FIG. 9, after the reflow, package 70 is cooled down. As a result of the cooling down, the warpage of top package 64 is at least partially relieved, and hence dams 60 move away from the top surface of package component 66. Underfill 72 is dispensed between top package 64 and package component 66. Underfill 72 may be in contact with surface dielectric layer 56. In some embodiments, dams 60 are not removed after the bonding process. Accordingly, underfill 72 contacts the bottom surfaces of dams 60, and may encircle each of the dams 60.

The embodiments of the present disclosure have some advantageous features. Dams are formed to control the size of solder balls during the reflow in packaging processes. The bridging problem caused by the crushing of solder balls, which crushing is further caused by the warpage of packages, is at least reduced, and possibly eliminated.

In accordance with some embodiments, a package structure includes a bottom package component, a top package component overlying and bonded to the bottom package component, and a dam between the bottom package component and the top package component. The dam has a top surface attached to a bottom surface of the top package component, and a bottom surface spaced apart from a top surface of the bottom package component.

In accordance with other embodiments, a package structure includes a top package, which includes a chip having through-vias therein, a top die bonded to the chip, and a molding compound over the chip and encircling the top die. A package substrate is underlying the top package, wherein the package substrate is bonded to the chip. A plurality of dams is between the top package and the package substrate, wherein each of the plurality of dams is adjacent to one of a plurality of corners of the chip.

In accordance with yet other embodiments, a method includes adhering a plurality of dams to a first side of a composite wafer, and sawing the composite wafer into a plurality of packages. Each of the plurality of packages includes a remaining portion of one of the plurality of dams. The method further includes bonding one of the plurality of packages to a bottom package component, wherein the remaining portion is between the one of the plurality of packages and the bottom package component.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A package structure comprising:
   a bottom package component;
   a top package component overlying and bonded to the bottom package component;
   a first dam, a second dam, a third dam, and a fourth dam between the bottom package component and the top package component, wherein each of the first dam, the second dam, the third dam, and the fourth dam comprises:
      a top surface; and
      a bottom surface spaced apart from a top surface of the bottom package component;
   an adhesive between and in contact with the bottom surface of the top package component and the top surface of each of the first, the second, the third, and the fourth dams;
   a solder region between and in contact with the top package component and the bottom package component, wherein bottom ends of the first, the second, the third, and the fourth dams are higher than a bottom end of the solder region when measured in a direction from the bottom end of the solder region toward the bottom surface of the top package component, wherein no additional dams are between the first, the second, the third, and the fourth dams, and a majority of perimeters of the top package component has no dam disposed thereon; and
   an underfill disposed between the top package component and the bottom package component, wherein portions of the underfill farther away from the bottom surface of the top package component extend more from outer edges of the first dam and the top package component than portions of the underfill closer to the bottom surface of the top package component.

2. The package structure of claim 1, wherein each of the first, the second, the third, and the fourth dams is adjacent to a corner of the top package component, with the first dam, the second dam, the third dam, and the fourth dam being adjacent to different corners of the top package component.

3. The package structure of claim 1, wherein the top package component comprises:
   a chip;
   a top die over and bonded to the chip; and
   a molding material encircling the top die, wherein the molding material is over the chip.

4. The package structure of claim 1, wherein the bottom package component comprises a package substrate.

5. The package structure of claim 1, wherein the first dam comprises a first edge and a second edge aligned to a first edge and a second edge, respectively, of the top package component.

6. The package structure of claim 1, wherein the underfill extends beyond outer edges of the first dam and the top package component in a direction parallel to the bottom surface of the top package component.

7. A package structure comprising:
   a top package comprising:
      a chip comprising through-vias therein;
      a top die bonded to the chip; and
      a molding compound over the chip and encircling the top die;
   a package substrate underlying the top package, wherein the package substrate is bonded to the chip;
   a plurality of dams between the top package and the package substrate, wherein each of the plurality of dams comprises silicon and is positioned adjacent to one of a plurality of corners of the chip; and
   an underfill between, and in contact with, the chip and the package substrate, wherein the underfill encircles the plurality of dams, and wherein the underfill contacts bottom surfaces of the plurality of dams.

8. The package structure of claim 7, wherein the chip comprises active devices therein.

9. The package structure of claim 7, wherein bottom surfaces of the plurality of dams are spaced apart from a top surface of the package substrate.

10. The package structure of claim 7, wherein each of the plurality of dams comprises a first edge and a second edge aligned to a first edge and a second edge, respectively, of the top package.

11. The package structure of claim 7, wherein the chip is an interposer chip free from active devices therein.

12. The package structure of claim 7, wherein the underfill extends beyond outer edges of one of the plurality of dams and the top package in a direction parallel to a bottom surface of the top package, and wherein portions of the underfill farther away from the bottom surface of the top package extend more from the outer edges than portions of the underfill closer to the bottom surface of the top package.

13. The package structure of claim 7, wherein the underfill completely encircles the plurality of dams.

14. The package structure of claim 7 further comprising:
an adhesive layer between and in contact with a top surface of each of the plurality of dams and a bottom surface of the top package; and
a solder region between and in contact with the top package and the package substrate, wherein bottom ends of the plurality of dams are higher than a bottom end of the solder region when measured in a direction from the bottom end of the solder region toward the bottom surface of the top package, and wherein no additional dams are between the plurality of dams, and a majority of perimeters of the top package has no dam disposed thereon.

15. A package structure comprising:
a first package component comprising a plurality of solder regions extending from a bottom surface of the first package component downwardly;
four dams, each at a corner of the first package component, wherein the four dams are attached to the bottom surface of the first package component, and bottom ends of the four dams are higher than bottom ends of the plurality of solder regions when measured in a direction from the bottom ends of the plurality of solder regions toward the bottom surface of the first package component, wherein no additional dams are between the four dams, and a majority of perimeters of the first package component has no dam disposed thereon; and
an adhesive layer between each of the four dams and the bottom surface of the first package component.

16. The package structure of claim 15, wherein each of the four dams comprises two edges aligned with respective edges of the first package component.

17. The package structure of claim 15 further comprising a second package component underlying and bonded to the first package component through the plurality of solder regions.

18. The package structure of claim 17, wherein the second package component has a top surface spaced apart from the bottom ends of the four dams.

19. The package structure of claim 15, wherein the four dams are formed of silicon, glass, metal, or an inorganic material.

20. The package structure of claim 15 further comprising an underfill on a side of the first package component, wherein the underfill is in contact with both an inner edge and an outer edge of each of the four dams, wherein the outer edge is aligned to an edge of the first package component, and the inner edge and the outer edge are opposite edges.

* * * * *